(12) United States Patent
Fukazawa et al.

(10) Patent No.: US 10,262,865 B2
(45) Date of Patent: Apr. 16, 2019

(54) METHODS FOR MANUFACTURING SEMICONDUCTOR DEVICES

(71) Applicant: ASM IP Holding B.V., Almere (NL)

(72) Inventors: Atsuki Fukazawa, Tama (JP); Toshihisa Nozawa, Kawasaki (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/488,318

(22) Filed: Apr. 14, 2017

(65) Prior Publication Data

US 2018/0301342 A1 Oct. 18, 2018

(51) Int. Cl.

| | |
|---|---|
| H01L 21/285 | (2006.01) |
| H01L 21/02 | (2006.01) |
| C23C 16/455 | (2006.01) |
| C23C 16/505 | (2006.01) |
| C23C 16/44 | (2006.01) |
| C23C 16/06 | (2006.01) |
| C23C 16/34 | (2006.01) |
| H01J 37/32 | (2006.01) |

(52) U.S. Cl.
CPC ........ *H01L 21/28556* (2013.01); *C23C 16/06* (2013.01); *C23C 16/34* (2013.01); *C23C 16/347* (2013.01); *C23C 16/4408* (2013.01); *C23C 16/45536* (2013.01); *C23C 16/505* (2013.01); *H01J 37/32082* (2013.01); *H01J 37/32449* (2013.01); *H01L 21/0228* (2013.01); *H01L 21/02164* (2013.01); *H01L 21/02274* (2013.01); *H01L 21/28568* (2013.01); *H01J 2237/3321* (2013.01)

(58) Field of Classification Search
CPC .......... H01L 21/0228; H01L 21/28556; H01L 21/28562; H01L 21/0217
See application file for complete search history.

(56) References Cited

U.S. PATENT DOCUMENTS

| 9,171,716 B2 | 10/2015 | Fukuda |
| 9,284,642 B2 | 3/2016 | Nakano et al. |
| 2009/0246952 A1* | 10/2009 | Ishizaka .................. C23C 16/34 438/653 |

* cited by examiner

*Primary Examiner* — Tony Tran
(74) *Attorney, Agent, or Firm* — Dorsey & Whitney LLP

(57) ABSTRACT

An example method for manufacturing a semiconductor device includes forming a nitride, carbide, or metal film on a substrate in a chamber using PE-ALD, Pulse-PE-CVD or PE-CVD, purging an interior of the chamber, forming an oxide film on the substrate in the chamber using PE-ALD, Pulse-PE-CVD or PE-CVD, and supplying a reducing gas into the chamber to create a reduction atmosphere and purging the interior of the chamber. The forming of the nitride film, carbide, or metal, purging, forming an oxide film, and supplying the reducing gas may be repeated a plurality of times.

13 Claims, 7 Drawing Sheets

FIG. 3

| Parameter | S1 PE-ALD | | | | S3 | | |
|---|---|---|---|---|---|---|---|
| | Feed1 | Purge1 | RF1 | Purge2 | Treatment Gas-Flow1 | RF2 | Purge3 |
| Material 1 | ▓ | | | | | | |
| Reactant Gas1 | ▓ | ▓ | ▓ | ▓ | | | |
| Carrier Gas | ▓ | ▓ | ▓ | ▓ | ▓ | ▓ | ▓ |
| Purge Gas | | | | | ▓ | ▓ | |
| RF | | | ▓ | | | ▓ | |

| Parameter | S4 PE-ALD | | | | S6 | | |
|---|---|---|---|---|---|---|---|
| | Feed2 | Purge4 | RF3 | Purge5 | Treatment Gas-Flow2 | RF4 | Purge6 |
| Material 2 | ▓ | | | | | | |
| Reactant Gas2 | ▓ | ▓ | ▓ | ▓ | | | |
| Carrier Gas | ▓ | ▓ | ▓ | ▓ | ▓ | ▓ | ▓ |
| Reducing Gas | | | | | ▓ | ▓ | |
| RF | | | ▓ | | | ▓ | |

FIG. 4

| Parameter | Feed1 | RF1 | Treatment Gas-Flow1 | RF2 | Purge3 |
|---|---|---|---|---|---|
| Material 1 | | | | | |
| Reactant Gas1 | | | | | |
| Carrier Gas | | | | | |
| Purge Gas | | | | | |
| RF | | | | | |

S1 Pulse PE-CVD (Feed1, RF1) — S3 (Treatment Gas-Flow1, RF2, Purge3)

| Parameter | Feed2 | RF3 | Treatment Gas-Flow2 | RF4 | Purge2 |
|---|---|---|---|---|---|
| Material 2 | | | | | |
| Reactant Gas2 | | | | | |
| Carrier Gas | | | | | |
| Reducing Gas | | | | | |
| RF | | | | | |

S4 Pulse PE-CVD (Feed2, RF3) — S6 (Treatment Gas-Flow2, RF4, Purge2)

FIG. 6

| | process | treatment | film type 1 | film type 2 | temp | raw material1 | raw material2 | reaction gas 1 | reaction gas 2 | Thickness 1 | Thickness 2 | sequence |
|---|---|---|---|---|---|---|---|---|---|---|---|---|
| Conventional example 1 | PEALD →PECVD | w/o | TiN | SiO | 500°C | TiCl4 | TEOS | H2/N2 | O2 | 10 | 10 | PE-ALD |
| Conventional example 2 | PEALD →PECVD | w/o | TiN | TiO | 400°C | TiCl4 | TiCl4 | H2/N2 | O2 | 10 | 10 | PE-ALD |
| example 1 | PEALD →PECVD | w/o | TiN | SiO | 500°C | TiCl4 | TEOS | H2/N2 | CO2 | 10 | 10 | PE-ALD |
| example 2 | PEALD →PECVD | W | TiN | TiO | 500°C | TiCl4 | TiCl4 | H2/N2 | CO2 | 10 | 10 | PE-ALD |
| example 3 | PEALD →PECVD | W | W | SiO | 400°C | WF6 | SiH4 | H2 | N2O | 10 | 10 | PE-ALD |
| example 4 | Pulse PECVD →PECVD | w/o | TiN | SiO | 500°C | TiCl4 | TEOS | H2/N2 | CO2 | 10 | 10 | Pulse PE-CVD |
| example 5 | Pulse PECVD →PECVD | W | TiN | SiO | 500°C | TiCl4 | TEOS | H2/N2 | CO2 | 10 | 10 | Pulse PE-CVD |
| example 6 | PEALD →PECVD | W | WCN | SiO | 500°C | WF6 | TEOS | hexane | CO2 | 10 | 10 | PE-ALD |

FIG. 7

| | First resistant value [μΩcm] | Second resistant value(after plasma) [μΩcm] | Accumulation [nm] | Adhesion Issue |
|---|---|---|---|---|
| Conventional example 1 | 90 | 140 | 1000 | Yes |
| Conventional example 2 | 90 | 160 | 1000 | Yes |
| example 1 | 90 | 99 | >3000 | No |
| example 2 | 90 | 91 | >3000 | No |
| example 3 | 16 | 18 | >3000 | No |
| example 4 | 90 | 100 | >3000 | No |
| example 5 | 90 | 91 | >3000 | No |
| example 6 | 37 | 39 | 2000 | No |

METHODS FOR MANUFACTURING SEMICONDUCTOR DEVICES

TECHNICAL FIELD

Examples described herein relate to methods for manufacturing semiconductor devices. Examples of semiconductor devices that may be manufactured include memory devices.

BACKGROUND

U.S. Pat. No. 9,171,716 discloses a method of forming a metal oxide hardmask on a template, comprising: (i) providing a template constituted by a photoresist or amorphous carbon formed on a substrate; and (ii) depositing by atomic layer deposition (ALD) a metal oxide hardmask on the template constituted by a material having a formula SixM (1−x)Oy wherein M represents at least one metal element, x is less than one including zero, and y is approximately two or a stoichiometrically-determined number.

U.S. Pat. No. 9,284,642 discloses a method for forming an oxide film of a metal or silicon by plasma-assisted processing such as plasma-enhanced atomic layer deposition (PEALD). More specifically, U.S. Pat. No. 9,284,642 discloses a method for forming an oxide film by plasma-assisted processing includes: (i) supplying a precursor reactive to none of oxygen, CxOy, and NxOy (x and y are integers) without a plasma to a reaction space wherein a substrate is placed; (ii) exposing the precursor to a plasma of CxOy and/or NxOy in the reaction space; and (iii) forming an oxide film on the substrate using the precursor and the plasma.

SUMMARY

According to one aspect of the present invention, a method for manufacturing a semiconductor device includes forming a nitride, carbide, or metal film, or combinations thereof, on a substrate in a chamber using PE-ALD, Pulse-PE-CVD, PE-CVD, or combinations thereof, purging an interior of the chamber, forming an oxide film on the substrate in the chamber using PE-ALD, Pulse-PE-CVD, PE-CVD, or combinations thereof, supplying a reducing gas into the chamber to create a reduction atmosphere and purging the interior of the chamber, and repeating said forming a nitride, carbide, or metal film, or combinations thereof, said purging, said forming an oxide film, and said supplying a reducing gas, a plurality of times in order.

BRIEF DESCRIPTION OF THE DRAWINGS

FIG. 3 is a diagram illustrating a specific sequence of the first film formation step, purging step, second film formation step and reduction step in FIG. 2;

FIG. 4 is a diagram illustrating a method for manufacturing a semiconductor device according to a second embodiment;

FIG. 6 is a table illustrating combination examples of the first film formation step and the second film formation step; and FIG. 7 is a table illustrating evaluation results.

DETAILED DESCRIPTION OF THE PREFERRED EMBODIMENTS

Figure 1:
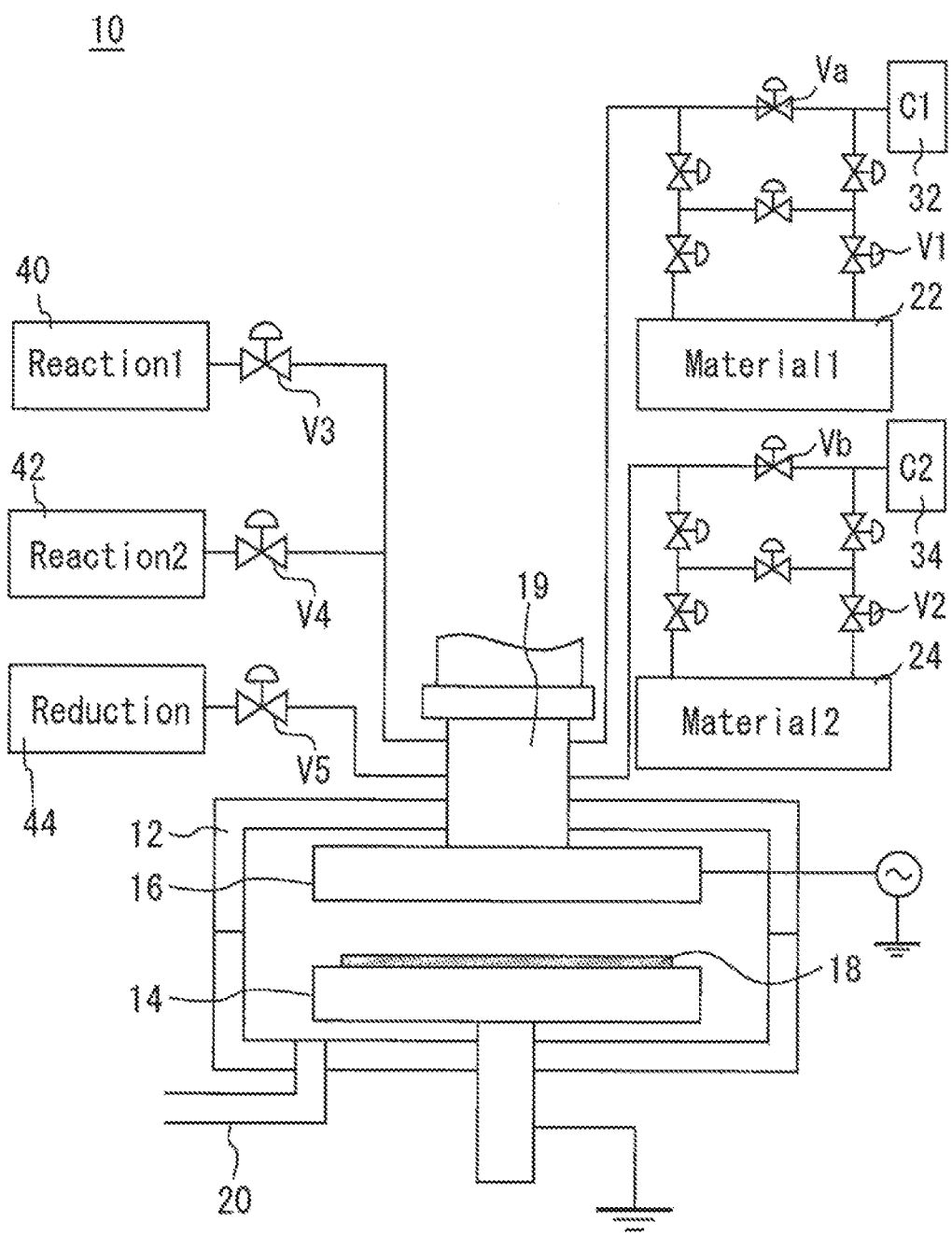
FIG. 1 is a cross-sectional view of a film formation apparatus used for a method for manufacturing a semiconductor device according to a first embodiment.

Next-generation device structures may require a lamination structure in which a nitride film, carbide or metal and an oxide film are alternately laminated on a substrate. This lamination structure includes a lamination structure of, for example, a barrier metal and a metal, and an oxide film. It is preferable to form the above-described lamination structure by providing a substrate in one chamber and continuously applying film formation processing to the substrate. However, while forming a lamination structure in one chamber, problems may occur at a stage at which an oxygen gas is introduced into the chamber to flow over a surface, such as the surface of a nitride film or the like of a base layer is oxidized and substituted or nitriding after oxidation becomes insufficient. In such a case, the nitride film of the base layer, carbide or metal is excessively oxidized at the time of deposition of the oxide film, and therefore there is a risk that a predetermined resistance value and surface condition cannot be achieved.

Thus, after forming a nitride film, carbide or metal on a substrate in a first chamber, the substrate may be conveyed to a second chamber, which is different from the first chamber, to form an oxide film in the second chamber. It is thereby possible to prevent the nitride film, carbide or metal from being excessively oxidized. However, causing the substrate to move to and from between the first chamber and the second chamber may deteriorate a throughput and prevent a substrate temperature from being kept substantially constant. It is for this reason that there is a demand for a method for manufacturing a semiconductor device that can form a lamination structure in one chamber while avoiding the above-described problem of excessive oxidation.

A method for manufacturing a semiconductor device according to an embodiment of the present invention will be described with reference to the accompanying drawings. The same or corresponding components will be assigned the same reference numerals and duplicate description may be omitted.

FIG. 1 is a cross-sectional view of a film formation apparatus 10 used for a method for manufacturing a semiconductor device according to a first embodiment. This film formation apparatus 10 may include a chamber 12. The chamber 12 may also be called a "reactor chamber." The chamber 12 is internally provided with a susceptor 14 and an RF plate 16 for radio frequency wave heating. The susceptor 14 and the RF plate 16 may serve as a pair of parallel planar electrodes. The susceptor 14 is electrically grounded and RF power is applied to the RF plate 16, and it is thereby possible to excite plasma between the electrodes. Processing using the plasma, such as film formation processing is applied to a substrate 18 provided on the susceptor 14.

The RF plate 16 may function as a shower plate. It is possible to supply a necessary gas into the chamber 12 via a manifold 19 and the RF plate 16. A flow rate of the gas supplied to the chamber 12 is controlled by, for example, a mass flow controller. The gas supplied to the chamber 12 is discharged from the chamber 12 through an exhaust pipe 20.

The film formation apparatus 10 is provided with a plurality of gas supply sources. More specifically, the film formation apparatus 10 is provided with a first material gas source 22, a second material gas source 24, carrier gas sources 32, 34, reaction gas sources 40, 42, and a reducing gas source 44. The first material gas source 22 and the second material gas source 24 store gas sources in a liquid state. Valves V1, Va, V2, Vb, V3, V4, V5 are connected to the respective gas sources.

Figure 2:
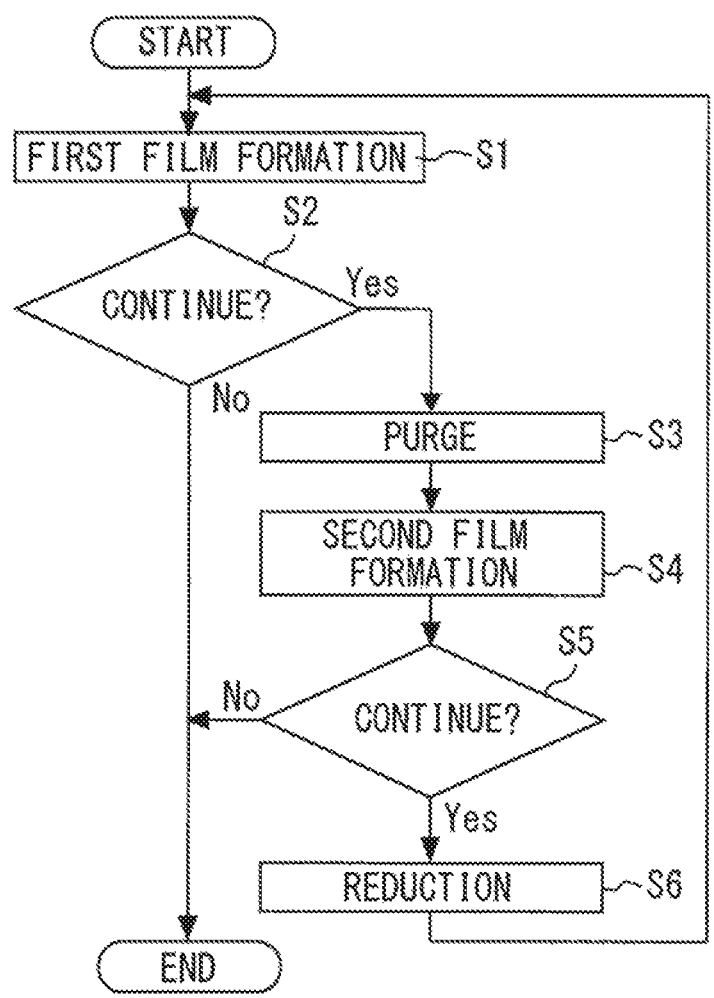
FIG. 2 is a flowchart illustrating the method for manufacturing the semiconductor device.

FIG. 2 is a flowchart illustrating a method for manufacturing a semiconductor device according to examples described herein. First, the substrate 18 is conveyed onto the susceptor 14, A first film is formed on the substrate in block S1. The first film may be a nitride, carbide, or metal film, or combinations thereof. The first film may be formed on the substrate in the chamber using PE-ALD, Pulse-PE-CVD, PE-CVD, or combinations thereof.

Next, in block S2, it is determined whether or not to continue film formation. This determination may be made based on a recipe. The recipe may, for example, be stored in electronic storage (e.g. memory) accessible to the film formation apparatus. When it is determined in block S2 that film formation will be continued, the process proceeds to block S3. Block S3 may include a purging step of purging the interior of the chamber 12. In the purging step, a purge gas may be supplied into the chamber 12 to purge the atmosphere in the chamber 12. Thus, the gas used in the first film formation step remaining as the atmosphere may be purged.

Next, the process proceeds to block S4, In block S4, an oxide film is formed on the substrate 18 in the chamber 12 through PE-ALD, Pulse-PE-CVD, PE-CVD, or combinations thereof. Block S4 may accordingly include formation of a second film." The oxide film may be preferably formed in acidulous gas as a reaction gas. The reaction gas may include some examples using $CO_2$, $N_2O$, ethanol, or combinations thereof.

Next, in block S5, it is determined whether or not to continue film formation. This determination may be made based on a recipe. When it is determined in block S5 that film formation will be continued, the process proceeds to block S6. Block S6 may include supplying a reducing gas to the chamber 12 to create a reduction atmosphere in the chamber 12 and purge the chamber 12. Supplying a reducing gas to the chamber can considerably reduce the oxygen content in the chamber 12.

Following block S5, the process may proceed again to block S1 to again form another film of nitride, carbide, metal, or combinations thereof. Thus, a series of processing may include formation of a nitride, carbide, and/or metal film, purging, formation of an oxide film, and reducing. These processes may be repeated in this order a plurality of times. It is thereby possible to form a lamination structure in which a nitride film, carbide or metal and an oxide film are alternately laminated on the substrate 18. Including reduction after formation of the oxide film may aid in preventing the film quality of the nitride film, carbide or metal from being unintentionally affected by oxygen. For example, it may be possible to set resistance values of the nitride film, carbide or metal to predetermined values—e.g. by controlling a composition and/or thickness of the materials. The lamination structure formed in the above-described processes may accordingly display excellent resistance controllability in some examples, which may make it easier to control power consumption of a resulting semiconductor device including the lamination structure. Example methods for manufacturing semiconductor devices described herein may accordingly be used for manufacturing of next-generation memory devices or logic devices. When a memory device or logic device is formed, a lamination structure may be formed using processes arranged in accordance with FIG. 2, and may, for example, include up to 45 layers in some examples, up to 40 layers in some examples, up to 50 layers in some examples, up to 60 layers in some examples. Other numbers of layers may be used in other examples.

The purging described with reference to block S3 of FIG. 2 may include purging the gas used in the formation of a nitride, carbide and/or metal film in block S1. Purging may prevent and/or reduce the incidence of the gas used in block S1 from affecting the processing during formation of an oxide film, e.g. in block S4. Accordingly, methods for manufacturing semiconductor devices described herein may include purging the gas used in forming a nitride, carbide, and/or metal film prior to forming an oxide film. Oxygen used to form the oxide film in block S4 may then be reduced, e.g. in block S6, followed by formation again of another nitride, carbide, and/or metal film (e.g. repeating block S1). In this manner, a laminated structure may be continuously formed on the substrate 18 in one chamber 12. This allow for an improvement of throughput and a lamination structure formed while keeping the substrate temperature substantially constant in some examples.

For formation of the nitride, carbide, and/or metal film (e.g. block S1), all kinds of methods may be adopted to form a nitride film, carbide or metal on the substrate through PE-ALD, Pulse-PE-CVD, and/or PE-CVD. Furthermore, for the formation of the oxide film (e.g. block S4), all kinds of method can be adopted to form an oxide film on the substrate through PE-ALD, Pulse-PE-CVD, and/or PE-CVD. In some examples, blocks S2 and S5 may be omitted and the processing may be ended at a stage at which film formation is completed a predetermined number of times.

FIG. 3 is a diagram illustrating a specific sequence of the first film formation (e.g. block S1 of FIG. 2), purging (e.g. block S3 of FIG. 2), second film formation (e.g. block S4 of FIG. 2) and reduction (e.g. block S6 of FIG. 2). Gases shown in blackened fields in FIG. 3 are supplied to the chamber 12 and gases in unblackened fields are not supplied to the chamber 12. During the first film formation step represented by block S1, four procedures—e.g. Feed 1, Purge1, RF 1 and Purge 2 are executed, in this order. In Feed 1, referring back to FIG. 1, five valves V1 and a valve Va are opened to supply vapor from the first material gas source 22 to the chamber 12 by carrier gas from carrier gas source 32. In Feed 1, valve V3 is also opened to supply a reactant gas to the chamber 12 from the reaction gas source 40. Examples of the reactant gas include helium, nitrogen, argon or oxygen. The carrier gas is a gas that guides the first material gas into the chamber 12. Examples of the carrier gas include helium, nitrogen or argon. A small step of "Feed" may be executed which may cause components of the material gas to be chemically adsorbed on the substrate 18.

In Purge 1, valves V1 are closed to stop providing the first material gas to the chamber 12 while maintaining the gas flow of the reactant gas and the carrier gas. A small step of "Purge" may be mainly executed to discharge impurity from the chamber 12. In RF 1, RF power is applied to the RF plate 16 while maintaining the gas flow of Purge 1. In "RF 1," for example, a TiN film is formed on the substrate using plasma. Next, in Purge 2, the application of RF power is stopped while maintaining the gas flows of Purge 1 and RF 1. During first film formation in FIG. 3, film formation is performed using a PE-ALD method. Four small procedures involved in the first film formation are executed in n cycles. The variable n is, for example, 300 to 400 in some examples. A TiN film may be formed on the substrate 18 in this process.

Next, the process proceeds to purging. During purging, e.g. represented by block S3, three procedures of Treatment Gas Flow 1, RF 2 and Purge 3 are executed in this order. In Treatment Gas Flow 1, a carrier gas is supplied to the chamber 12 from the carrier gas source 32 through the valve Va. A known purge gas is supplied into the chamber 12 from the reducing gas source 44 to purge the atmosphere in the chamber 12. Although the purging gas is not particularly limited, Hydrogen-containing gas is preferably used.

In RF 2, RF power is applied to the RF plate 16 while maintaining the gas flow of Treatment Gas Flow 1. In this way, for example, NH ions are generated and the NH ions are discharged out from the chamber 12. In Purge 3, only the carrier gas is supplied to the chamber 12 from the carrier gas source 32. Thus, during purging, it is preferable to supply a reducing gas such as Hydrogen-containing gas into the chamber 12 to create a reduction atmosphere and purge the interior of the chamber 12. However, during some examples of purging, the reduction atmosphere may not be created in the chamber 12 but an inert gas may simply be caused to flow through the chamber 12.

Next, the process proceeds to second film formation. During second film formation, e.g. represented by block S4, Feed 2, Purge 4, RF 3 and Purge 5 are executed in this order. In Feed 2, five valves V2 and a valve Vb are opened to supply vapor from the second material gas source 24 to the chamber 12 by carrier gas from carrier gas source 34. In Feed 1, valve V4 is also opened to supply a reactant gas to the chamber 12 from the reaction gas source 42. The gas supplied from the reaction gas source 42 is a gas used to form an oxide film. The reaction gas source 42 preferably supplies not $O_2$, but a weakly acidic gas such as $CO_2$, $N_2O$ or ethanol. In Feed 2, components of the second material gas are chemically adsorbed on the substrate 18.

In Purge 4, valves V2 are closed to stop providing the second material gas to the chamber 12 while maintaining the gas flow from the carrier gas source 34 and reaction gas source 42. In Purge 4, the reactant gas and the carrier gas are supplied to the chamber 12. In RF 3, RF power is applied to the RF plate 16 while maintaining the gas flow of Purge 4. In this way, a silicon oxide film is formed on the TiN film. Purge 5 is the same processing as that of aforementioned Purge 4. Four small steps of the second film formation step are executed in n cycles. The variable n is, for example, 300 to 400 in some examples.

During the second film formation (e.g. block S4), if $O_2$ is used as the reactant gas, by only causing $O_2$ to flow in Feed 2, the surface of the film formed in the first film formation step of TiN or the like may be oxidized. However, if weakly acidic $CO_2$, $N_2O$ or ethanol is used as the reactant gas as described above, it may be possible in some examples to reduce influences on the film formed in block S1. Therefore, the oxide film may be preferably formed using a weakly acidic reactant gas. The same applies to a case where carbide or metal is formed in block S1. Note that if $H_2O$ is used as the reactant gas during the second film formation (e.g. block S4), $H_2O$ may have catalyst reaction with the metallic chamber 12, and therefore the use of $H_2O$ should be avoided in some examples.

Next, the process proceeds to a reduction (e.g. block S6 of FIG. 2). During reduction, three steps of Treatment Gas Flow 2, RF 4 and Purge 6 are executed in this order. In Treatment Gas Flow 2, a carrier gas is supplied to the chamber 12 from the carrier gas source 34 and a reducing gas is supplied to the chamber 12 from the reducing gas source 44. This may be referred to as a "treatment gas flow."

Hydrogen-containing gas is preferably used as the reducing gas. Hydrogen-containing gas includes, for example, $H_2$ gas and $NH_3$ gas.

In RF 4, RF power is applied to the RF plate 16 while maintaining the gas flow of Treatment Gas Flow 2. For example, RF power is applied to the RF electrode while continuing the supply of the carrier gas and the reducing gas. During application of RF power, OH ions are generated in the chamber 12 and the OH ions are discharged out from the chamber 12. In Purge 6 after the application of RF power, a carrier gas is supplied to the chamber 12 from the carrier gas source 34. For example, the application of RF power may be canceled and a carrier gas is supplied into the chamber 12. This discharging may clean the interior of the chamber after the application of RF power.

When the first film and the second film are alternately formed a plurality of times in one chamber 12, after an oxide film is formed, the oxygen atmosphere may remain no matter how much purging is performed. Therefore, during reduction (e.g., block S6) oxygen may be discharged out from the chamber 12 in the form of "OH" using "reducing gas" $H_2$ of a hydrogen-based gas. During reduction, a reduction atmosphere may be created in the chamber 12. The reduction atmosphere is an atmosphere having a large content of reducing gas which is a gas having a property of depriving oxygen such as hydrogen, carbon monoxide, hydrogen sulfide or sulfur dioxide. Adopting the reduction atmosphere may make it possible to efficiently remove oxygen used in the oxide film formation from the chamber 12. The reduction atmosphere may not be necessary during purging (e.g. block S3) in some examples because it may only be desired to remove oxygen used in formation of the oxide film (e.g. in block S4) from the chamber 12.

In example methods for manufacturing semiconductor devices described herein, it may be possible to form a next nitride, carbide, and/or metal film under an atmosphere with sufficiently reduced oxygen by removing oxygen in the chamber from the chamber in a reduction after forming an oxide film. Various modifications can be made without departing from this feature.

For example, in during a first film formation, a nitride film other than TiN may be formed. Moreover, not only the nitride film but also a carbide film or metal film may be formed. The carbide film may be, for example, WCN and the metal film may be, for example, W. When a nitride film, carbide film or metal film is formed and an oxide film is next formed in, there may be a problem that oxygen remaining in the chamber 12 may affect a subsequent nitride, carbide, and/or metal film formation, and therefore the above-described reduction may be effective.

It may be preferable in some examples to create a reduction atmosphere also during purging after formation of a nitride, carbide, and/or metal film (e.g. in block S3 of FIG. 2). For example, when carbide is formed in block S2, hydrocarbon may be generated by supplying Hydrogen containing gas to the chamber during purging in block S3 and the hydrocarbon may be discharged out from the chamber. For example, using a reducing gas such as $H_2$ in the purging step after forming WCN, it is possible to discharge CH-based hydrocarbon or OH-based hydrocarbon from the chamber 12. Even when a metal is formed in block S3, it may be preferable to use a reducing gas in the purging step.

If a second film (e.g. an oxide film) is formed in a chamber different from the chamber in which the first film (e.g. a nitride, carbide, and/or metal film) is formed, the temperature of the substrate may decrease or the surface of the first film (e.g. TiN) may be oxidized by air break or TiN may be damaged. When the film of TiN or the like is oxidized, there may be a problem that oxidation rapidly advances in the subsequent second film formation (e.g. oxide film). Thus, examples described herein may provide for purging and reducing so that the first film formation and the second film formation may be repeated in one chamber 12 without problems, or with reduced incident of problems. Since the lamination structure can be formed in one chamber 12, the temperature of the substrate can be kept constant during the first film formation, purging, second film formation and reduction.

Modifications are applicable to the methods for manufacturing described herein. Some variations from above-described examples are further provided herein.

FIG. 4 is a diagram illustrating a method for manufacturing a semiconductor device according to examples described herein. In FIG. 4, a first film formation and a second film formation are executed using Pulse-PE-CVD. During the first film formation represented by block S1, Feed 1 and RF 1 are executed in this order. In Feed 1, the first material gas, carrier gas, and reactant gas are supplied to the chamber 12 from the first material gas source 22, carrier gas source 32, and reaction gas source 40, and RF power is applied to the RF plate 16. Next, in RF 1, RF power is applied to the RF plate 16 with the reactant gas and the carrier gas flowing from the reaction gas source 40 and carrier gas source 32 into the chamber 12. Two small steps made up of Feed 1 and RF 1 are executed in n cycles, where n is an arbitrary positive integer. During the first film formation, a nitride film, carbide film or metal film is formed.

During second film formation represented by block S4, Feed 2 and RF 3 are executed in this order. In Feed 2, the second material gas, carrier gas, and reactant gas are supplied to the chamber 12 from the second material gas source 24, carrier gas source 34, and reaction gas source 42, and RF power is applied to the RF plate 16. Next, in RF 3, the reactant gas and carrier gas are supplied to the chamber 12 from the reaction gas source 42 and carrier gas source 34, and RF power is applied to the RF plate 16. Two small steps made up of Feed 2 and RF 3 are executed in n cycles. An oxide film is formed during the second film formation. In this way, the first film formation and the second film formation may be executed using Pulse-PE-CVD.

During a reduction after the second film formation, oxygen is removed from the chamber 12, and then the first film formation is again executed. It is thereby possible to form a lamination structure in which the nitride film, carbide or metal and oxide film are alternately laminated in one chamber 12.

Figure 5:
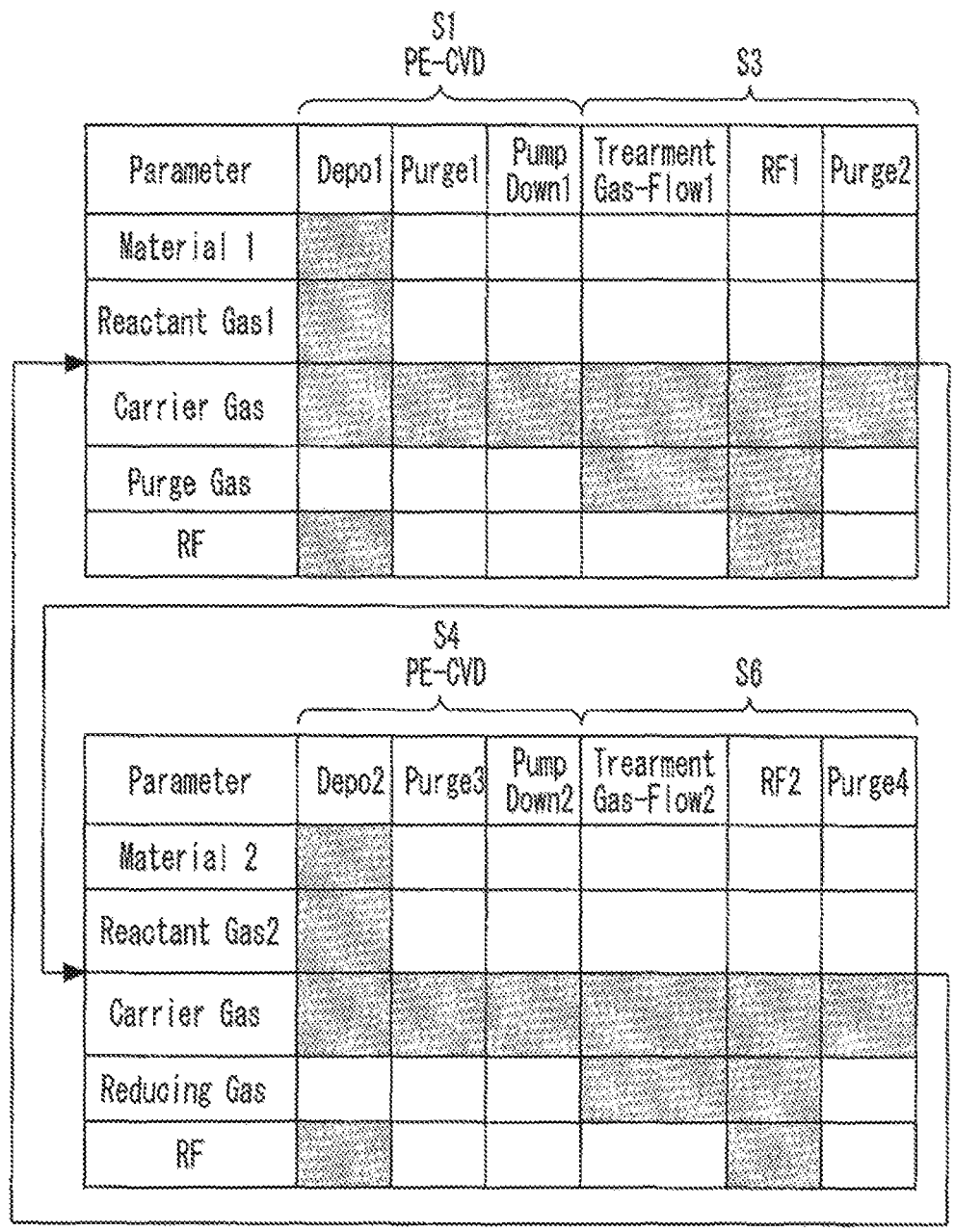
FIG. 5 is a diagram illustrating a method for manufacturing a semiconductor device according to a third embodiment.

FIG. 5 is a diagram illustrating a method for manufacturing a semiconductor device according to examples described herein. In FIG. 5, the first film formation and the second film formation are executed using PE-CVD. During the first film formation represented by block S1, Depo 1, Purge 1 and PumpDown 1 are executed in this order. In Depo 1, the first material gas, carrier gas, and reactant gas are supplied to the chamber 12 from the first material gas source 22, carrier gas source 32, and reaction gas source 40, and RF power is applied to the RF plate 16. In Purge 1, the carrier gas is supplied to the chamber 12 from the carrier gas source 32. Two small steps made up of Depo 1 and Purge 1 are executed in n cycles, where n is an arbitrary positive integer. In PumpDown 1, the carrier gas is supplied to the chamber 12 from the carrier gas source 32. During the first film formation, a nitride film, carbide film or metal film is formed.

During the second film formation represented by block S4, Depo 2, Purge 3 and PumpDown 2 are executed in this order. In Depo 2, the second material gas, carrier gas, and reactant gas are supplied to the chamber 12 from the second material gas source 24, carrier gas source 34 and reaction gas source 42, and RF power is applied to the RF plate 16. In Purge 3, the carrier gas is supplied to the chamber 12 from the carrier gas source 34. Two small steps made up of Depo 2 and Purge 3 are executed in n cycles. In PumpDown 2, the carrier gas is supplied to the chamber 12 from the carrier gas source 34. An oxide film is formed during the second film formation. In this way, the first film formation and the second film formation may be executed using PE-CVD.

During the reduction after the second film formation, oxygen is removed from the chamber, and then the first film formation is again executed. In this way, it is possible to form a lamination structure in which the nitride film, carbide or metal and oxide film are alternately laminated in one chamber 12 without problems or with a reduced incidence of problems.

In the sequence in FIG. 3, the first film formation and the second film formation are executed using PE-ALD, in the sequence in FIG. 4, the first film formation and the second film formation are executed using Pulse-PE-CVD, and in the sequence in FIG. 5, the first film formation and the second film formation are executed using PE-CVD. However, as described, any one of PE-ALD, Pulse-PE-CVD and PE-CVD may be adopted to form the first film, and an oxide film may be formed on the substrate using PE-ALD, Pulse-PE-CVD or PE-CVD during the second film formation. Therefore, the first film formation and the second film formation may be executed using different film formation methods. For example, the first film formation may be executed using PE-ALD and the second film formation may be executed using PE-CVD.

FIG. 6 is a table illustrating combination examples of the first film formation and the second film formation. Conventional examples 1 and 2 are processes without the purging and the reduction. Examples 1 to 6 are processes that include the purging and the reduction and introduce a reducing gas into the chamber in these steps. The "process" column describes the film formation method in the first film formation and the second film formation. For example, in the process of conventional example 1, the first film formation is executed using PE-ALD and the second film formation is executed using PE-CVD. The "treatment" column shows the presence or absence of treatment in each process. "Film type 1" is a film formed in the first film formation and "film type 2" is a film formed in the second film formation. "Temperature" represents a substrate temperature. "Raw material 1" is a gas supplied from the first material gas source 22 as a raw material of "film type 1." "Raw material 2" is a gas supplied from the second material gas source 24 as a raw material of "film type 2." "Reaction gas 1" is a gas supplied from the reaction gas source 40 as a reactant gas used in the first film formation. "Reaction gas 2" is a gas supplied from the reaction gas source 42 as a reactant gas used in the second film formation. "Thickness 1" and "thickness 2" represent a film thickness of the film formed in the first film formation and a film thickness of the film formed in the second film formation, shown in units of nm. The "sequence" field shows a film formation method in the first film formation.

FIG. 7 is a table illustrating evaluation results of the films manufactured in the eight processes in FIG. 6. A resistance value shown on the "first resistance value" column is a resistance value of the film formed in the first film formation measured immediately after the first film formation. A resistance value shown on the "second resistance value" column is a resistance value of the film formed in the first film formation after an oxide film is formed in the second film formation. Therefore, the "first resistance value" and the "second resistance value" are preferably substantially equal.

In the processes of conventional examples 1 and 2, the second resistance values are significantly larger than the first resistance values. In the processes of conventional examples 1 and 2, $O_2$ is used as a reactant gas in the second film formation, and it is therefore assumed that oxidation of the film formed in the first film formation step has advanced. Such an advance of oxidation can be prevented and/or reduced in some examples using a weakly acidic material as a reactant gas in the second film formation.

Since there is no reduction in conventional examples 1 and 2, oxygen used in the second film formation may remain in the chamber in the first film formation, which may cause oxidization of the film formed in the first film formation. In contrast, in examples 1 to 6, a weakly acidic reactant gas was used in the second film formation, oxygen was removed from the chamber in the reduction, and then the first film formation was executed. For this reason, it was possible to suppress oxidation of the film in the first film formation and cause the first resistance value to substantially match the second resistance value.

The "Accumulation" column shows a thickness of a film that can be formed on the substrate by the time peeling occurs in the films laminated on the inner wall of the chamber. When the "Accumulation" value is small, chamber cleaning using a fluorine layer or the like is often necessary. "Accumulation" in the processes in conventional examples 1 and 2 was 1000 nm. In conventional examples 1 and 2, $O_2$ was used as a reactant gas in the second film formation, and therefore oxidation of, for example, TiN formed in the first film formation advances and TiO increases. The advancement of the oxidation of TiN is also attributable to the fact that oxygen used in the second film formation remained in the chamber in the first film formation. This is assumed to be responsible for an increase in film stress and a decrease in the "Accumulation" value. In contrast, in examples 1 to 6, it was possible to secure "Accumulation" of 3000 nm or more. In examples 1 to 6, a weakly acidic material such as $CO_2$, $N_2O$ or ethanol was used as a reactant gas in the second film formation, and it is thereby possible in some examples to prevent and/or reduce oxidation of, for example, TiN formed in the first film formation. Furthermore, the existence of the reduction also contributes to preventing oxidation of TiN in some examples.

The "Adhesion" column shows an adhesion property of the formed film. The adhesion property of the film was determined by pasting a tape to the film, then peeling the tape from the film and determining whether or not the film was peeled by the tape, "Yes" shows that the film was peeled by the tape and "No" shows that the film was not peeled by the tape. It is appreciated that the film formed in the steps in examples 1 to 5 displayed a good adhesion property since oxidation of the film formed in the first film formation step was prevented and/or reduced in some examples.

Many modifications and variations of the present invention are possible in the light of the above teachings. It is therefore to be understood that within the scope of the appended claims variations may be practiced otherwise than as specifically described.

What is claimed is:

1. A method for manufacturing a semiconductor device, the method comprising:
   forming a nitride, carbide, or metal film, or combinations thereof, on a substrate in a chamber using PE-ALD, Pulse-PE-CVD, PE-CVD, or combinations thereof;
   purging an interior of the chamber;
   forming an oxide film on the substrate in the chamber using PE-ALD, Pulse-PE-CVD, PE-CVD, or combinations thereof;
   supplying a reducing gas into the chamber to create a reduction atmosphere and purging the interior of the chamber;
   repeating said forming a nitride, carbide, or metal film, or combinations thereof, said purging, said forming an oxide film, and said supplying a reducing gas, a plurality of times in order; and
   during said forming the oxide film, a silicon oxide film is formed;
   wherein said supplying the reducing gas into the chamber comprises:
   supplying the reducing gas together with a carrier gas into the chamber;
   applying RF power to an RF electrode while continuing to supply the carrier gas and the reducing gas; and
   canceling application of the RF power and supplying the carrier gas into the chamber;
   wherein during said applying RF power to the RF electrode, OH ions are generated in the chamber and the OH ions are discharged out from the chamber.

2. The method for manufacturing a semiconductor device according to claim 1, wherein the reducing gas is Hydrogen-containing gas.

3. The method for manufacturing a semiconductor device according to claim 1, wherein helium, nitrogen, argon, or combinations thereof, is used as the carrier gas.

4. The method for manufacturing a semiconductor device according to claim 1,
   wherein during said forming the nitride, carbide, or metal film, TiN, WCN or W is formed on the substrate.

5. The method for manufacturing a semiconductor device according to claim 1,
   wherein during said forming the nitride, carbide, or metal film, carbide is formed, and
   during said purging, Hydrogen-containing gas is supplied to the chamber to generate hydrocarbon and the hydrocarbon is discharged out from the chamber.

6. The method for manufacturing a semiconductor device according to claim 1, wherein during said purging, a reducing gas is supplied into the chamber to create a reduction atmosphere and purge the interior of the chamber.

7. The method for manufacturing a semiconductor device according to claim 1, wherein said forming the nitride, carbide, or film, said purging, said forming the oxide film, and said reducing are repeated in this order a plurality of times to thereby form at least a portion of a memory device.

8. The method for manufacturing a semiconductor device according to claim 1, wherein during said forming the nitride, carbide, or metal film, said purging, said forming the oxide film, and said reducing, a temperature of the substrate is kept constant.

9. The method for manufacturing a semiconductor device according to claim 1, wherein forming an oxide film on the substrate in the chamber includes forming the oxide film on the substrate in an acidulous gas atmosphere.

10. The method for manufacturing a semiconductor device according to claim 9, wherein the acidulous gas atmosphere includes CO2, N2O or ethanol.

11. The method for manufacturing a semiconductor device according to claim 1, wherein a significant portion of the oxide film includes a compound of a metal and oxygen.

12. The method for manufacturing a semiconductor device according to claim 1, wherein said forming an oxide film occurs before said supplying a reducing gas into the chamber.

13. A method for manufacturing a semiconductor device, the method comprising:

forming a nitride, carbide, or metal film, or combinations thereof, on a substrate in a chamber using PE-ALD, Pulse-PE-CVD, PE-CVD, or combinations thereof;

purging an interior of the chamber; forming an oxide film on the substrate in the chamber using PE-ALD, Pulse-PE-CVD, PE-CVD, or combinations thereof by:

supplying a material to the chamber from a material gas source; and supplying a reactant gas to the chamber from a reaction gas source, wherein the reactant gas supplied to the chamber is distinct from the material gas supplied to the chamber and the reaction gas source is distinct from the material gas source;

supplying a reducing gas into the chamber to create a reduction atmosphere and purging the interior of the chamber; and repeating said forming a nitride, carbide, or metal film, or combinations thereof, said purging, said forming an oxide film, and said supplying a reducing gas, a plurality of times in order;

wherein forming an oxide film on the substrate in the chamber includes, after supplying the material to the chamber from the material gas source and before supplying a reducing gas into the chamber, ceasing to supply the material to the chamber while continuing to supply the reactant gas; and wherein forming an oxide film on the substrate in the chamber includes, after ceasing to supply the material to the chamber, applying radio frequency power to a radio frequency plate that is disposed in the chamber while continuing to supply the reactant gas.

* * * * *